(12) United States Patent
Shimoishizaka et al.

(10) Patent No.: US 8,283,775 B2
(45) Date of Patent: Oct. 9, 2012

(54) WIRING BOARD, SEMICONDUCTOR DEVICE AND METHOD FOR MANUFACTURING THE SAME

(75) Inventors: Nozomi Shimoishizaka, Kyoto (JP); Yoshifumi Nakamura, Osaka (JP); Kouichi Nagao, Kyoto (JP)

(73) Assignee: Panasonic Corporation, Osaka (JP)

( * ) Notice: Subject to any disclaimer, the term of this patent is extended or adjusted under 35 U.S.C. 154(b) by 44 days.

(21) Appl. No.: 13/049,307

(22) Filed: Mar. 16, 2011

(65) Prior Publication Data

US 2011/0163436 A1 Jul. 7, 2011

Related U.S. Application Data

(63) Continuation of application No. PCT/JP2009/003753, filed on Aug. 5, 2009.

(30) Foreign Application Priority Data

Oct. 3, 2008 (JP) ................................ 2008-258674

(51) Int. Cl.
*H01L 23/34* (2006.01)
*H01L 23/10* (2006.01)
(52) U.S. Cl. ................ 257/707; 257/E23.103; 257/690; 257/706; 257/712; 438/122; 438/125
(58) Field of Classification Search ........... 257/E21.505, 257/E23.103, E23.08, 690, 706, 707, 712, 257/717, 719, 720, 723, 796; 438/117, 121, 438/122, 124–127
See application file for complete search history.

(56) References Cited

U.S. PATENT DOCUMENTS

| | | | | |
|---|---|---|---|---|
| 5,616,957 | A * | 4/1997 | Kajihara | 257/712 |
| 6,190,945 | B1 * | 2/2001 | Akram | 438/122 |
| 6,429,513 | B1 * | 8/2002 | Shermer et al. | 257/714 |
| 6,462,405 | B1 * | 10/2002 | Lai et al. | 257/675 |
| 6,519,154 | B1 * | 2/2003 | Chiu | 361/704 |

(Continued)

FOREIGN PATENT DOCUMENTS

JP 62-144346 6/1987

(Continued)

*Primary Examiner* — Chris Chu
(74) *Attorney, Agent, or Firm* — Panasonic Patent Center

(57) ABSTRACT

A semiconductor device including a semiconductor element 1 having an active element region 1a, a plurality of element electrodes 2 formed on a principal face of the semiconductor element, external terminals 6 and 7 connected to one or more element electrodes via connection members 8 and 9, one or more first heat-dissipation protrusions 4 formed on the principal face of the semiconductor element, an insulation resin layer 10 covering the principal face of the semiconductor element and the first heat-dissipation protrusions, and a heat-dissipation medium 11 contacting a face of the insulation resin layer on a side opposite to a side contacting front faces of the first heat-dissipation protrusions. At least a part of the active element region is included in a region below a bottom face of the first heat-dissipation protrusion, the first heat-dissipation protrusion is not connected to the external terminal within the active element region, a thermal conductivity of the first heat-dissipation protrusion is larger than a thermal conductivity of the insulation resin layer, and a thickness of the insulation resin layer from the front face of the first heat-dissipation protrusion to the heat-dissipation medium is thinner than a thickness of the insulation resin layer from the principal face of the semiconductor element to the heat-dissipation medium. Thereby, it is possible to improve the speed of dissipating heat from the active element region of the mounted semiconductor element to the heat-dissipation medium.

9 Claims, 14 Drawing Sheets

U.S. PATENT DOCUMENTS

| | | | |
|---|---|---|---|
| 6,559,525 B2 * | 5/2003 | Huang | 257/675 |
| 6,599,779 B2 * | 7/2003 | Shim et al. | 438/122 |
| 6,734,552 B2 * | 5/2004 | Combs et al. | 257/707 |
| 6,946,729 B2 * | 9/2005 | Lee et al. | 257/707 |
| 7,064,428 B2 * | 6/2006 | Tong et al. | 257/707 |
| 7,135,782 B2 * | 11/2006 | Nishikawa | 257/796 |
| 7,202,561 B2 * | 4/2007 | Seo | 257/720 |
| 2002/0109226 A1 * | 8/2002 | Khan et al. | 257/737 |
| 2002/0190362 A1 * | 12/2002 | Khan et al. | 257/678 |
| 2002/0190397 A1 * | 12/2002 | Kim | 257/796 |
| 2007/0045824 A1 * | 3/2007 | Zhao et al. | 257/706 |
| 2007/0108598 A1 * | 5/2007 | Zhong et al. | 257/707 |

FOREIGN PATENT DOCUMENTS

| | | |
|---|---|---|
| JP | 10-65072 | 3/1998 |
| JP | 10-233473 | 9/1998 |
| JP | 2000-286368 | 10/2000 |
| JP | 2007-115760 | 5/2007 |
| JP | 2007-158165 | 6/2007 |

* cited by examiner

US 8,283,775 B2

WIRING BOARD, SEMICONDUCTOR DEVICE AND METHOD FOR MANUFACTURING THE SAME

BACKGROUND OF THE INVENTION

1. Field of the Invention

The present invention relates to a heat dissipation configuration of a semiconductor element mounted on a wiring board, and a method for manufacturing the same.

2. Description of Related Art

A configuration that allows heat generated from an active element region of a semiconductor element mounted on a wiring board to dissipate on the wiring board is disclosed in, for example, JP 10-65072 A (Patent Document 1). According to the configuration, at least one heat-dissipation protrusion is provided on the board on which the semiconductor element is mounted facedown, in such a manner that the protrusion is opposed to the semiconductor element with a little space therebetween. Further, a heat conductive insulator is filled in a space between the semiconductor element and the heat-dissipation protrusion.

Hereinafter, a method for manufacturing the semiconductor device of a conventional example will be described with reference to FIG. 13. FIG. 13 is a cross-sectional view of the semiconductor device of the conventional example.

In FIG. 13, conductive wirings 42 and a heat-dissipation conductive wiring 43 are formed on a wiring board 41. Heat-dissipation protrusions 44 are formed on the heat-dissipation conductive wiring 43. A semiconductor element 45 is flip-chip mounted on the wiring board 41 via element electrodes 46 of the semiconductor element 45 and connecting protrusion electrodes 47 formed on the element electrodes 46.

A reference numeral 48 illustrated by a dotted line refers to an active element region of the semiconductor element 45. A ground electrode 49 is provided on the active element region 48. A surface passivation film 50 is formed on a surface of the semiconductor element 45. A heat conductive insulator 51 is filled between the semiconductor element 45 and the wiring board 41.

According to the configuration described above, heat generated in the active element region 48 is allowed to be diffused in a horizontal direction by the ground electrode 49, dissipated via the heat conductive insulator 51, and then dissipated from the heat-dissipation protrusions 44 through the heat-dissipation conductive wiring 43 to the wiring board 41. Further, since the heat-dissipation protrusions 44 and the semiconductor element 45 are not connected, there is an advantage of reducing variations in electric characteristics of the active element region 48, as compared with a general heat dissipation configuration (for example, see JP 2000-286368 A (Patent Document 2)) shown in FIG. 14.

The semiconductor device of FIG. 14 has a heat dissipation configuration in which the semiconductor element 45 and the wiring board 41 are connected by the connecting protrusion electrodes 47. Because of this, variations in electric characteristics of the active element region 48 occur due to the load at the time of the flip-chip mounting of the semiconductor element 45 on the wiring board 41 or the stress to the active element region 48 caused by the difference in thermal expansion coefficient between the semiconductor element 45 and the wiring board 41 after the mounting. On the contrary, the configuration such as shown in FIG. 13 in which the heat-dissipation protrusions 44 and the semiconductor element 45 are not connected reduces the occurrence of such a stress.

[Patent Document 1] JP 10-65072 A
[Patent Document 2] JP 2000-286368 A

SUMMARY OF THE INVENTION

In the conventional semiconductor device described above, in order to improve the speed of dissipating heat from the active element region 48, it is required that the ground electrode 49 that is positioned near a heat generation source, i.e., the active element region 48, is made thick so as to increase the speed of diffusing heat in the ground electrode 49 in the horizontal direction. However, in the above-described conventional semiconductor device, since the ground electrode 49 is formed in a step of forming a wiring layer of the semiconductor element 45, it cannot be formed in an arbitrary thickness (generally about 0.5 µm). Because of this, a limit is imposed in the speed of diffusing heat in the ground electrode 49 in the horizontal direction, which slows down the speed of dissipating heat from the active element region 48 to the wiring board 41.

The present invention solves the conventional problem described above, and its object is to provide the semiconductor device that is improved in the speed of dissipating heat from the active element region of the semiconductor element to the wiring board, and a method for manufacturing the same.

The semiconductor device of the present invention includes: a semiconductor element having an active element region; a plurality of element electrodes formed on a principal face of the semiconductor element; an external terminal connected to the one or more element electrodes via a connection member; one or more first heat-dissipation protrusions formed on the principal face of the semiconductor element; an insulation resin layer covering the principal face of the semiconductor element and the first heat-dissipation protrusion; and a heat-dissipation medium contacting a face of the insulation resin layer on a side opposite to a side contacting a front face of the first heat-dissipation protrusion. At least a part of the active element region is included in a region below a bottom face of the first heat-dissipation protrusion, the first heat-dissipation protrusion is not connected to the external terminal within the active element region, a thermal conductivity of the first heat-dissipation protrusion is larger than a thermal conductivity of the insulation resin layer, and a thickness of the insulation resin layer from the front face of the first heat-dissipation protrusion to the heat-dissipation medium is thinner than a thickness of the insulation resin layer from the principal face of the semiconductor element to the heat-dissipation medium.

The method for manufacturing the semiconductor device of the present invention includes: forming a first conductive wiring and a second conductive wiring on a wiring board; forming a plurality of wiring protrusion electrodes on the first conductive wiring and a plurality of second heat-dissipation protrusions on the second conductive wiring in the same thickness; forming an element protrusion electrode on each of a plurality of element electrodes formed on a principal face of a semiconductor element and a first heat-dissipation protrusion on each of a plurality of heat-dissipation electrodes formed on the principal face of the semiconductor element in the same thickness using a material having a hardness higher than a hardness of a material of the wiring protrusion electrodes; arranging the wiring board and the semiconductor element so that the wiring protrusion electrode and the corresponding element protrusion electrode are opposed to each other, and the first heat-dissipation protrusion and the second heat-dissipation protrusion establish a horizontal positional relationship in which a top portion of one of the heat-dissipation protrusions is surrounded by adjacent top portions of the other heat-dissipation protrusion; and flip-chip mounting the semiconductor element on the wiring board by connecting the element protrusion electrode and the wiring protrusion electrode while squashing the top portion of the wiring protrusion electrode, in such a manner as to arrange the top portion of the first heat-dissipation protrusion and the top portion of the second heat-dissipation protrusion at a position where the respective side faces are opposed to each other.

According to the present invention, heat generated in the active element region of the mounted semiconductor element is diffused via the heat-dissipation protrusion in the horizontal direction and transmitted via the insulation resin layer to the heat-dissipation medium, whereby it is possible to improve the speed of dissipating heat from the active element region to the heat-dissipation medium.

DETAILED DESCRIPTION OF THE INVENTION

Figure 1A:
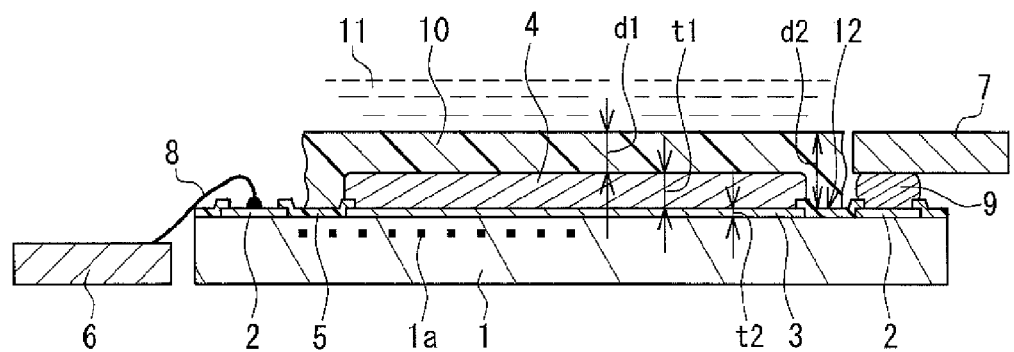
FIG. 1A is a cross-sectional view showing main portions of a semiconductor device as a first configuration example in Embodiment 1 of the present invention.

Based on the above configuration, the present invention may have the following aspects.

In the semiconductor device having the above-described configuration, the first heat-dissipation protrusion preferably is formed so as to extend from above the inside of the active element region to the outside thereof and is connected to the external terminal outside the active element region.

The first heat-dissipation protrusion contains the same material as that of the connection member.

Further, a thermal conductivity of the heat-dissipation medium preferably is larger than the thermal conductivity of the insulation resin layer.

Further, the heat-dissipation medium is a wiring board, the semiconductor element is flip-chip mounted on the wiring board, the external terminal is formed of a part of a conductive wiring formed on the wiring board, the first heat-dissipation protrusion is formed so as to extend from above the inside of the active element region to the outside thereof and is connected to the external terminal outside the active element region, and the conductive wiring is formed so as to extend from a region opposed to the first heat-dissipation protrusion via end portions of the semiconductor element to a region where the semiconductor element is not flip-chip mounted.

Further, the heat-dissipation medium is a wiring board, the semiconductor element is flip-chip mounted on the wiring board, and the wiring board includes: a plurality of first conductive wirings formed on an upper face of the wiring board; a second conductive wiring formed on the wiring board at a position opposed to a region where the first heat-dissipation protrusion is formed; and a plurality of second heat-dissipation protrusions formed on the second conductive wiring. A part of the first conductive wiring functions as the external terminal and is connected to the element electrode via the connection member, each top portion of the second heat-dissipation protrusions is surrounded by adjacent top portions of the first heat-dissipation protrusions and the respective side faces are opposed to each other without contacting with each other, and an insulation resin is filled in a space between the second heat-dissipation protrusions and the first heat-dissipation protrusions.

Still further, an end portion of the first conductive wiring on a side connected to the element electrode via the connection member extends toward a center of the semiconductor element so as to form the second conductive wiring.

Still further, the heat-dissipation medium is a wiring board, the semiconductor element is flip-chip mounted on the wiring board, and the wiring board includes: a plurality of first conductive wirings formed on an upper face of the wiring board; a second conductive wiring formed on the wiring board at a position opposed to a region where the first heat-dissipation protrusion is formed; and a plurality of second heat-dissipation protrusions formed on the second conductive wiring. The element electrode and the first conductive wiring are connected via the connection member, each top portion of the second heat-dissipation protrusions is surrounded by adjacent top portions of the first heat-dissipation protrusions and the respective side faces are opposed to each other and in contact with each other, and an insulation resin is filled in a space between the second heat-dissipation protrusions and the first heat-dissipation protrusions.

Hereinafter, embodiments of the present invention will be described with reference to the drawings.

Embodiment 1

The configuration of a semiconductor device in Embodiment 1 of the present invention will be described with reference to FIGS. 1A to 1D. The present embodiment shows a basic concept of the present invention in which a protrusion electrode for heat dissipation (hereinafter, referred to as a heat-dissipation protrusion) is provided in a semiconductor element (chip).

FIG. 1A is a cross-sectional view showing main portions of the semiconductor device as a first configuration example in the present embodiment. A semiconductor element 1 includes an active element region 1a, and a plurality of element electrodes 2 are formed on a principal face of the semiconductor element 1 (upper face in the drawing) that is peripheral to the active element region 1a. Further, a heat-dissipation electrode 3 is formed in a region including at least a part of the active element region 1a. A first heat-dissipation protrusion 4 is formed on the heat-dissipation electrode 3. A passivation film 5 is provided in such a manner as to cover a region of the principal face of the semiconductor element 1 where the element electrodes 2 and the heat-dissipation electrode 3 are not formed.

External terminals 6 and 7 are provided in the vicinity of the element electrodes 2 of the semiconductor element 1. The external terminal 6 shown in the left side part of FIG. 1A is arranged laterally to the element electrode 2 and connected to the element electrode 2 via a connection member made of a wire 8. The external terminal 7 shown in the right side part of FIG. 1A is arranged parallel to the element electrode 2 in a vertical direction and connected to the element electrode 2 via a connection member made of a protrusion electrode 9. Note here that although two kinds of the external terminals 6 and 7 are shown as examples, either one of the configurations is used in general.

An insulation resin layer 10 is provided so as to cover the first heat-dissipation protrusion 4 and the passivation film 5 that are on the principal face of the semiconductor element 1. Although only illustrated partially in FIG. 1A, a heat-dissipation medium 11 is provided so as to be in contact with a front face of the insulation resin layer 10, i.e., a face thereof on the side opposite to the side contacting a front face of the first heat-dissipation protrusion 4. The heat-dissipation medium 11 may be gas such as air or liquid.

As described above, at least a part of the active, element region 1a is included in a region below a bottom face of the first heat-dissipation protrusion 4, and in the active element region 1a, the first heat-dissipation protrusion 4 is not connected to the external terminals 6 and 7. Further, a thermal conductivity κ1 of the first heat-dissipation protrusion 4 is larger than a thermal conductivity κ2 of the insulation resin layer 10 (κ1>κ2). Further, a thickness d1 of the insulation resin layer 10 from the front face of the first heat-dissipation protrusion 4 to the heat-dissipation medium 11 is thinner than a thickness d2 of the insulation resin layer 10 from a principal face 12 of the semiconductor element 1 to the heat-dissipation medium 11 (d1<d2). Note here that a thickness t1 of the first heat-dissipation protrusion 4 preferably is thicker than a thickness t2 of the heat-dissipation electrode 3 (t1>t2).

According to the configuration described above, by providing the first heat-dissipation protrusion 4 on the active element region 1a of the semiconductor element 1, heat generated in the active element region 1a is diffused rapidly by the first heat-dissipation protrusion 4 in a horizontal direction and then is dissipated via the insulation resin layer 10 to the heat-dissipation medium 11. Thus, it is possible to improve the speed of dissipating heat from the active element region 1a, as compared with the conventional configuration not provided with the first heat-dissipation protrusion 4.

Figure 1B:
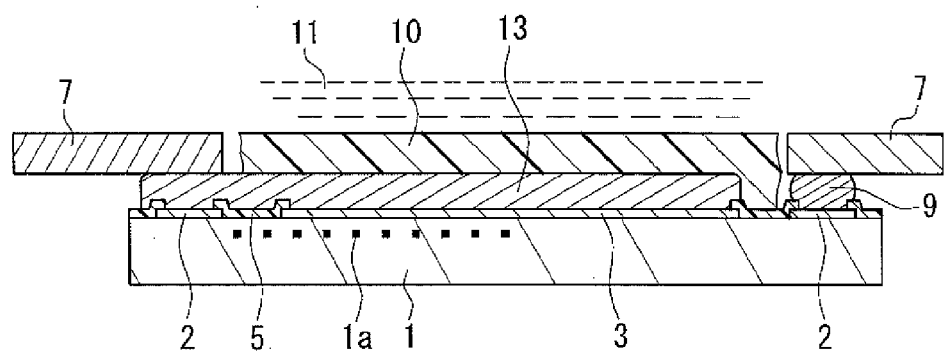
FIG. 1B is a cross-sectional view showing main portions of a semiconductor device as a second configuration example in Embodiment 1.

FIG. 1B is a cross-sectional view showing main portions of the semiconductor device as a second configuration example in the present embodiment. The same reference numerals are assigned to the same components as those of the semiconductor device in the first configuration example for avoiding the duplication of explanations. In this configuration example, a first heat-dissipation protrusion 13 is formed in such a manner as to extend from above the inside of the active element region 1a to the outside thereof and connected to the external terminals 7 outside the active element region 1a.

Figure 1C:
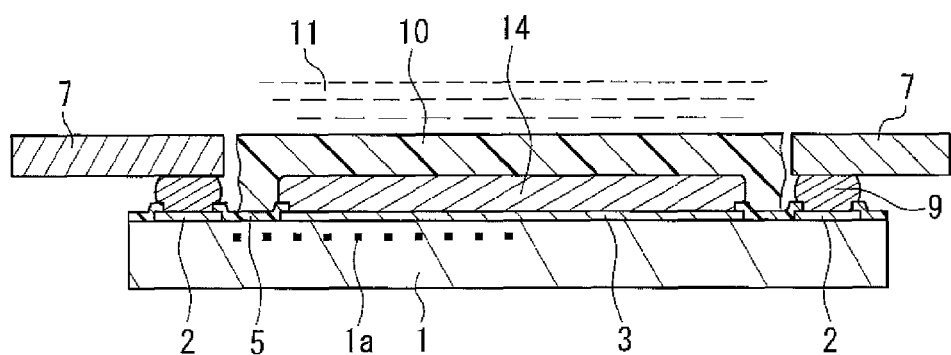
FIG. 1C is a cross-sectional view showing main portions of a semiconductor device as a third configuration example in Embodiment 1.

FIG. 1C is a cross-sectional view showing main portions of the semiconductor device as a third configuration example in the present embodiment. In this configuration example, a first heat-dissipation protrusion 14 is formed to contain the same material as that of the protrusion electrode 9 which is a connection member.

Figure 1D:
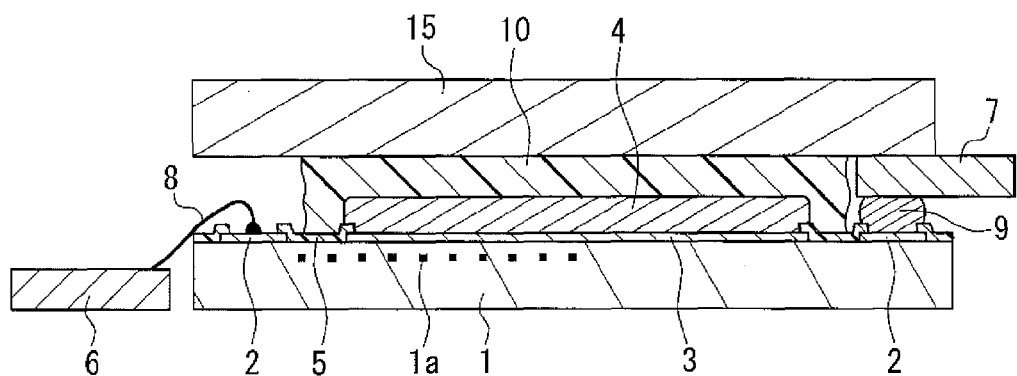
FIG. 1D is a cross-sectional view showing main portions of a semiconductor device as a fourth configuration example in Embodiment 1.

FIG. 1D is a cross-sectional view showing main portions of the semiconductor device as a fourth configuration example in the present embodiment. In this configuration example, instead of using the gaseous or liquid heat-dissipation medium 11 in the above-described example, a heat-dissipation plate 15 made of, for example, metal is used as a heat-dissipation medium. A thermal conductivity κ3 of the heat-dissipation plate 15 is larger than the thermal conductivity κ2 of the insulation resin layer 10 (κ3>κ2). Thus, it is possible to improve the heat dissipation efficiency.

Embodiment 2

The configuration of the semiconductor device in Embodiment 2 of the present invention will be described with reference to FIGS. 2A, 2B, 3A and 3B. In the present embodiment, as more specific configurations of the semiconductor device in Embodiment 1, first to fourth configuration examples in which the semiconductor element is mounted on a wiring board or a lead frame in a face-up manner are shown.

Figure 2A:
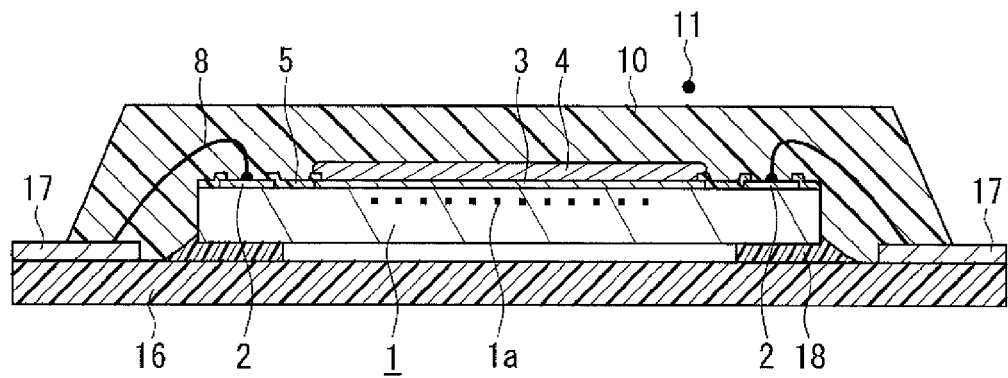
FIG. 2A is a cross-sectional view showing a semiconductor device as a first configuration example in Embodiment 2 of the present invention.

FIG. 2A is a cross-sectional view showing the semiconductor device as a first configuration example in the present embodiment. The configuration of the semiconductor element 1 is identical to that of the semiconductor element 1 in Embodiment 1 shown in FIG. 1A and the like, and therefore the same reference numerals are assigned to the same components for avoiding the duplication of explanations. Further, regarding other components, the same reference numerals are assigned to the same components.

A plurality of first conductive wirings 17 are provided on a wiring board 16, and external terminals are formed of a part of the first conductive wirings 17. The semiconductor element 1 is mounted on the wiring board 16 and fixed by an adhesive 18, and one or more element electrodes 2 are connected to the first conductive wirings 17 (external terminals) via the connection members made of the wires 8.

The insulation resin layer 10 is provided on the wiring board 16 in such a manner as to cover the semiconductor element 1, wires 8, and connection portions of the first conductive wirings 17. Further, a region contacting the front face of the insulation resin layer 10, i.e., the face thereof on the side opposite to the side contacting the front face of the first heat-dissipation protrusion 4 functions as the heat-dissipation medium 11.

As for the wiring board 16, for example, a polyimide film having a thickness of about 40 μm can be used. As for the material for forming the first conductive wiring 17, a Cu foil having a thickness of about 8 μm can be used. Further, the element electrode 2 and heat-dissipation electrode 3 can be formed of Al having a thickness of about 0.5 μm. The first heat-dissipation protrusion 4 can be formed of electroless plated Ni having a thickness of about 3 μm, with a surface of the electroless plated Ni being covered by electroless plated Au having a thickness of about 0.05 μm. Further, as for the insulation resin layer 10, for example, a general epoxy-based resin can be used.

According to the configuration of the semiconductor device of the present embodiment, similarly to the case of Embodiment 1, by the function of the first heat-dissipation protrusion 4 that enables heat to diffuse in the horizontal direction, it is possible to obtain an effect of improving the speed of dissipating heat from the active element region 1a.

Figure 2B:
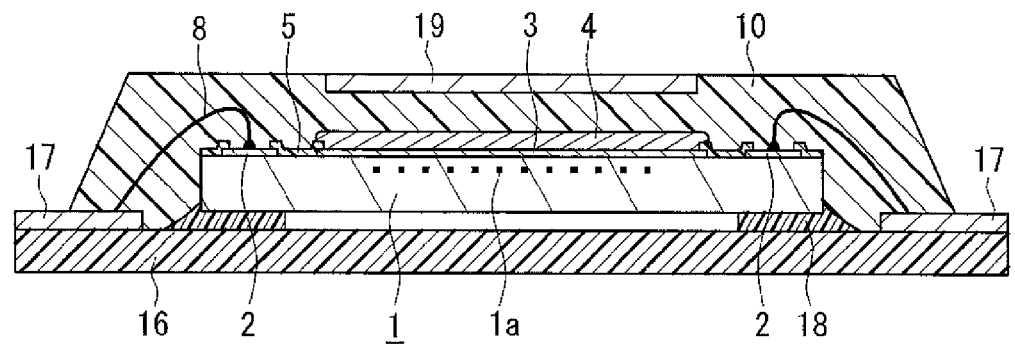
FIG. 2B is a cross-sectional view showing a semiconductor device as a second configuration example in Embodiment 2.
Figure 3A:
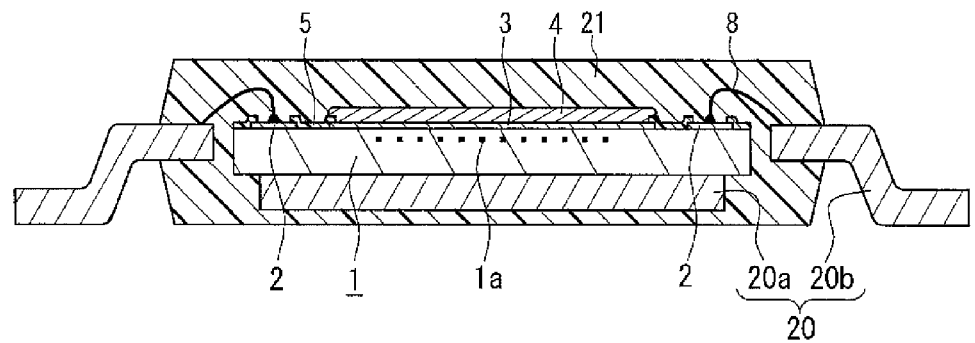
FIG. 3A is a cross-sectional view showing a semiconductor device as a third configuration example in Embodiment 2.
Figure 3B:
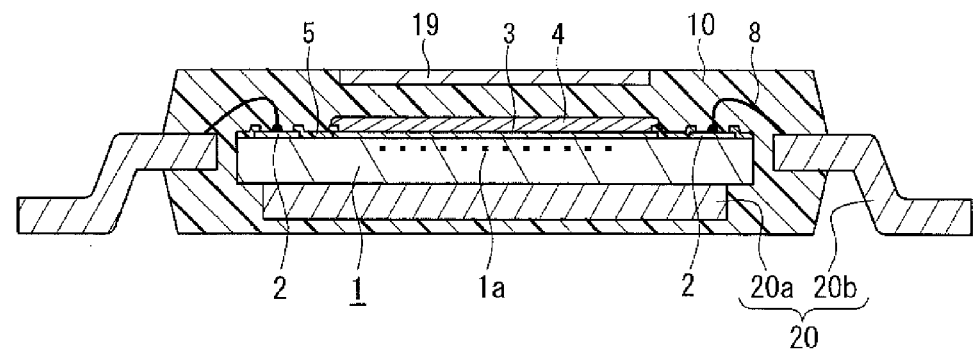
FIG. 3B is a cross-sectional view showing a semiconductor device as a fourth configuration example in Embodiment 2.

The semiconductor device in the present embodiment may adopt the configuration of modification examples, such as shown in FIGS. 2B, 3A and 3B. All of these examples have an aspect in which the semiconductor element 1 is mounted in a face-up manner.

FIG. 2B is a cross-sectional view showing the semiconductor device as a second configuration example in the present embodiment. This semiconductor device has a configuration basically identical to that shown in FIG. 2A, but is different in that a heat-dissipation plate 19 is provided in the insulation resin layer 10, instead of the heat-dissipation medium 11 in FIG. 2A. As for the heat-dissipation plate 19, for example, a metal plate can be used.

FIG. 3A is a cross-sectional view showing the semiconductor device as a third configuration example in the present embodiment. The semiconductor device uses a lead frame 20 instead of the wiring board 16 in the first configuration example shown in FIG. 2A. The semiconductor element 1 is mounted in a face-up manner on a die pad 20a of the lead frame 20, and the element electrodes 2 are connected via the wires 8 to leads 20b that are external terminals. An insulation resin layer 21 seals a region including the die pad 20a, semiconductor element 1, and a part of the leads 20b. Note here that the illustration of the heat-dissipation medium is omitted.

FIG. 3B is a cross-sectional view showing the semiconductor device as a fourth configuration example in the present embodiment. This semiconductor device has a configuration basically identical to that shown in FIG. 3A, but is different in that the heat-dissipation plate 19 is arranged in the insulation resin layer 21 as a heat-dissipation medium.

Embodiment 3

The configuration of the semiconductor device in Embodiment 3 of the present invention will be described with reference to FIGS. 4A to 11B. In the present embodiment, as more specific configurations of the semiconductor device in Embodiment 1, first to eighth configuration examples in which the semiconductor element 1 is mounted in a face-down manner on the wiring board 16 are shown. The configurations of the semiconductor element 1 and the wiring board 16 substantially are identical to those of the above-described embodiments, and therefore the same reference numerals are assigned to the same components for avoiding the duplication of explanations.

Figure 4A:
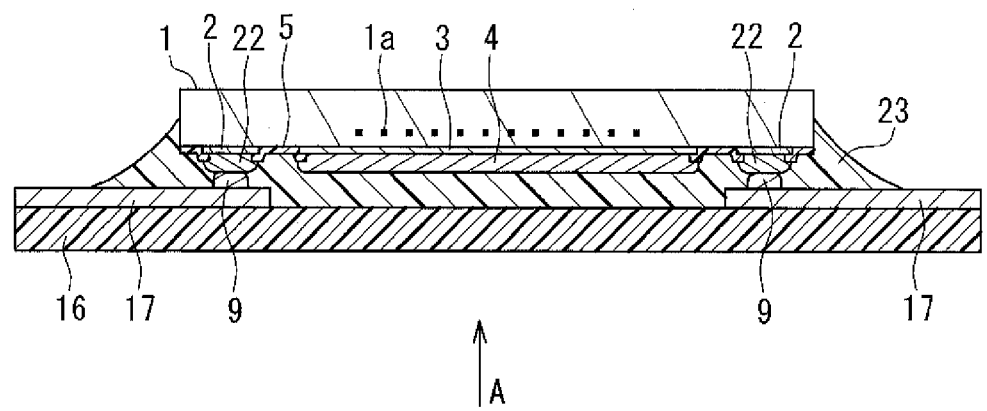
FIG. 4A is a cross-sectional view showing a semiconductor device as a first configuration example in Embodiment 3 of the present invention.
Figure 4B:
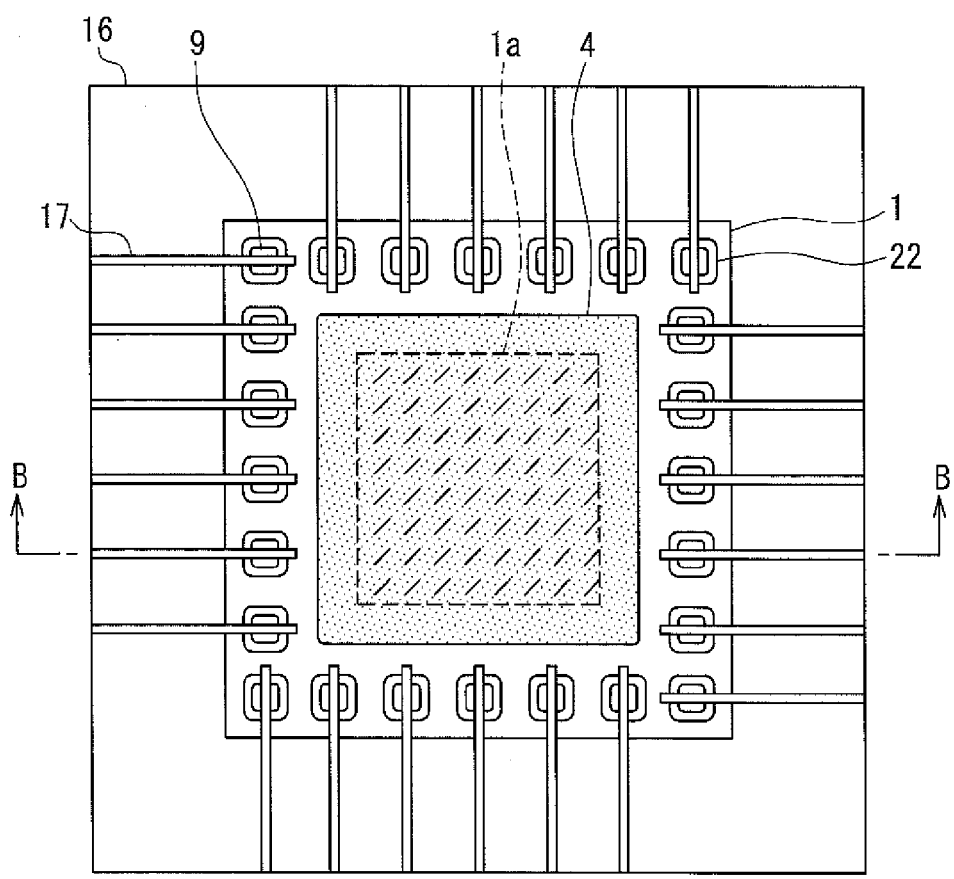
FIG. 4B is a bottom view of the same semiconductor device.

FIG. 4A is a cross-sectional view showing the semiconductor device as a first configuration example in the present embodiment. FIG. 4B is a bottom view of FIG. 4A (seen from the direction indicated by an arrow A), and is illustrated by viewing through some of the members. Note here that FIG. 4A shows a cross section taken along a line B-B in FIG. 4B.

The heat-dissipation electrode 3 is formed in a region including at least a part of the semiconductor element 1. The first heat-dissipation protrusion 4 thicker than the heat-dissipation electrode 3 is formed on the heat-dissipation electrode 3. The passivation film 5 is provided in such a manner as to cover the region of the principal face of the semiconductor element 1 where the element electrodes 2 and the heat-dissipation electrode 3 are not formed.

The first conductive wirings 17 are formed on the wiring board 16. The protrusion electrodes 9 that are connection members are formed on the first conductive wirings 17. The semiconductor element 1 is flip-chip mounted on the wiring board 16 via the element electrode 2 and a protrusion electrode 22 that is a connection member formed on the element electrode 2. An insulation resin layer 23 is provided so as to fill a space between the semiconductor element 1 and the wiring board 16.

According to the first configuration example, the heat generated in the active element region 1a is diffused by the first heat-dissipation protrusion 4 in the horizontal direction and then is dissipated via the insulation resin layer 23 to the wiring board 16. Thus, it is possible to improve the speed of dissipating heat from the active element region 1a to the wiring board 16, as compared with the configuration not provided with the first heat-dissipation protrusion 4. The wiring board 16 functions as the heat-dissipation medium 11 in Embodiment 1.

Figure 5A:
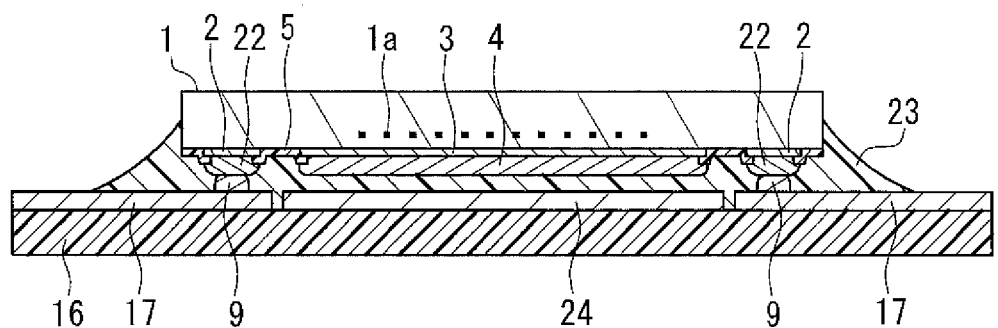
FIG. 5A is a cross-sectional view showing a semiconductor device as a second configuration example in Embodiment 3.
Figure 5B:
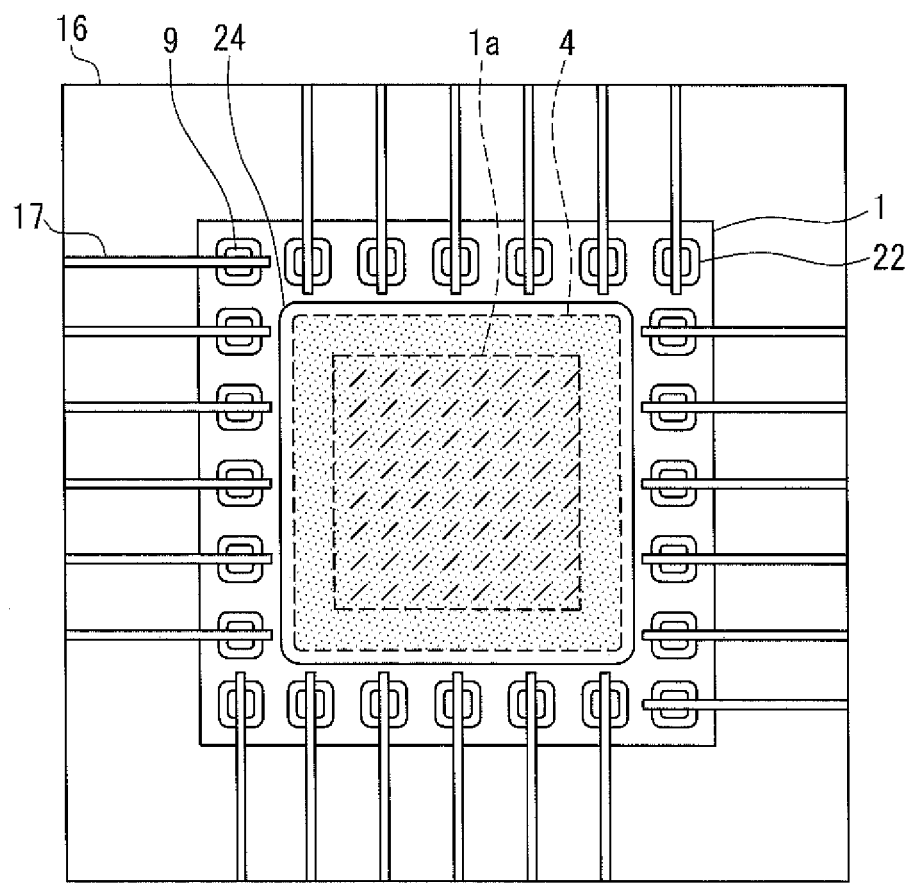
FIG. 5B is a bottom view of the same semiconductor device.

FIG. 5A is a cross-sectional view showing the semiconductor device as a second configuration example in the present embodiment. FIG. 5B is a bottom view of FIG. 5A, and is illustrated by viewing through some of the members. The configuration of this semiconductor device substantially is identical to that of the semiconductor device of the first configuration example, but is different in that a second conductive wiring 24 is provided on the wiring board 16 in addition to the first conductive wirings 17.

The second conductive wiring 24 is formed on a portion of the wiring board 16 opposed to the first heat-dissipation protrusion 4. Although the first conductive wirings 17 and the element electrodes 2 are connected to each other via the protrusion electrodes 9 and 22 that are connection members, the second conductive wiring 24 and the first heat-dissipation protrusion 4 are not in contact with each other.

As an example, a polyimide film having a thickness of about 40 μm is used for the wiring board 16. The first conductive wiring 17 and the second conductive wiring 24 are formed of Cu having a thickness of about 8 μm. Further, the protrusion electrode 9 is formed of electro plated Cu having a thickness of about 6 μm, with a surface of the electro plated Cu being covered with electro plated Au having a thickness of about 0.5 p.m.

Further, the element electrode 2 and the heat-dissipation electrode 3 are formed of Al having a thickness of about 0.5 μm. The protrusion electrode 22 and the first heat-dissipation protrusion 4 are formed of electroless plated Ni having a thickness of about 3 μm, with a surface of the electroless plated Ni being covered by electroless plated Au having a thickness of about 0.05 µm. Further, as for the insulation resin layer 23, a general epoxy-based resin is used.

According to the second configuration example, heat is dissipated from the first heat-dissipation protrusion 4 via the insulation resin layer 23 to the second conductive wiring 24, and then is dissipated to the wiring board 16. Therefore, by means of the second conductive wiring 24, it is possible further to improve the speed of dissipating heat from the active element region 1a to the wiring board 16. The second conductive wiring 24 also functions as the heat-dissipation medium 11 in Embodiment 1.

Figure 6:
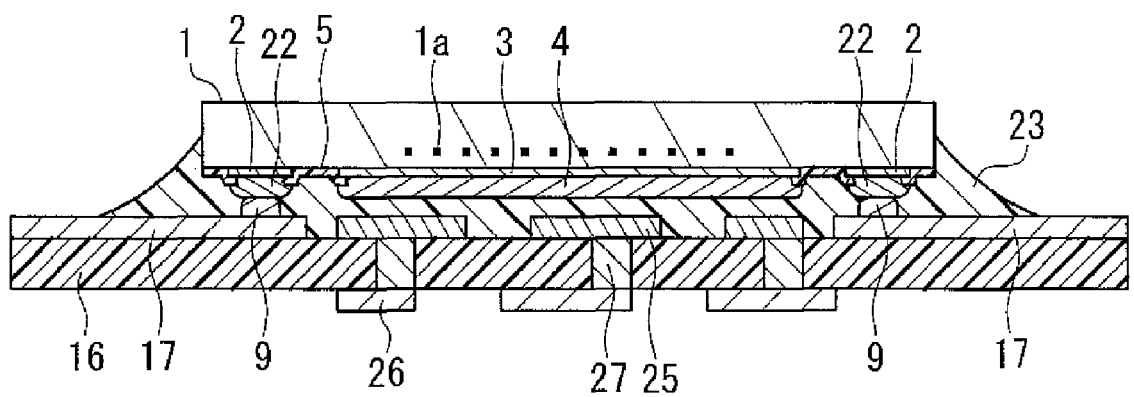
FIG. 6 is a cross-sectional view showing a semiconductor device as a third configuration example in Embodiment 3.

FIG. 6 is a cross-sectional view showing the semiconductor device as a third configuration example in the present embodiment. The configuration of this semiconductor device substantially is identical to that of the semiconductor device of the second configuration example, but is different in that a second conductive wiring 25 corresponding to the second conductive wiring 24 is separated in plural parts and a backface conductive wiring 26 is formed on a back face of the wiring board 16. Further, the second conductive wiring 25 and the back-face conductive wiring 26 are connected by a via 27.

According to the third configuration example, heat is dissipated from the first heat-dissipation protrusion 4 via the insulation resin layer 23 to the second conductive wiring 25, transmitted further through the via 27 to the back-face conductive wiring 26, and then diffused. Thus, by means of the via 27 and the back-face conductive wiring 26, it is possible further to improve the speed of dissipating the heat having passed from the active element region 1a to the first heat-dissipation protrusion 4.

Figure 7A:
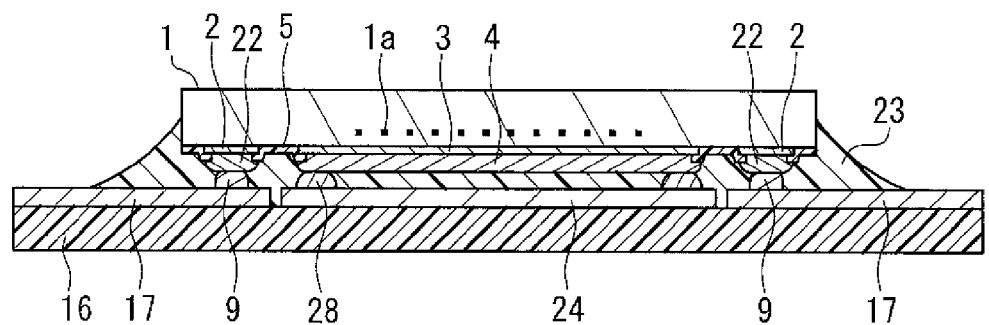
FIG. 7A is a cross-sectional view showing a semiconductor device as a fourth configuration example in Embodiment 3.
Figure 7B:
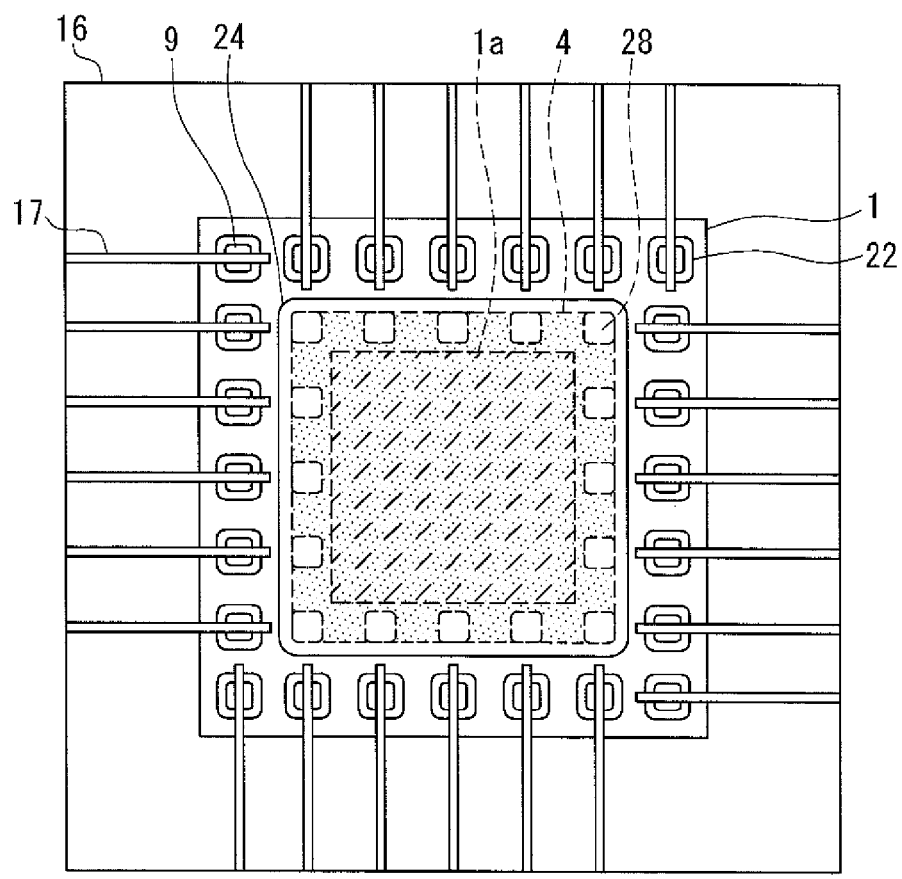
FIG. 7B is a bottom view of the same semiconductor device.

FIG. 7A is a cross-sectional view showing the semiconductor device as a fourth configuration example in the present embodiment. FIG. 7B is a bottom view of FIG. 7A, and is illustrated by viewing through some of the members. In FIGS. 7A and 7B, the same reference numerals are assigned to the same components as those of the second configuration example shown in FIGS. 5A and 5B for avoiding the duplication of explanations.

A feature of the fourth configuration example is that second heat-dissipation protrusions 28 are formed on the second conductive wiring 24, and connected to the first heat-dissipation protrusion 4. The second conductive wiring 24 does not come into contact with the first heat-dissipation protrusion 4 on the active element region 1a, and is connected to the first heat-dissipation protrusion 4 via the second heat-dissipation protrusions 28 formed at a position outside the active element region 1a.

According to the present configuration example, the heat generated in the active element region 1a is diffused in the horizontal direction via the first heat-dissipation protrusion 4, and further is dissipated via the second heat-dissipation protrusions 28 to the second conductive wiring 24. Thus, it is possible further to improve the speed of dissipating heat from the active element region 1a to the wiring board 16. Moreover, since the second heat-dissipation protrusions 28 are formed at the position outside the active element region 1a, it is possible to reduce a situation that the stress during and after the flip-chip mounting of the semiconductor element 1 is applied to the active element region 1a via the second heat-dissipation protrusions 28, whereby variations in electric characteristics of the active element region 1a can be suppressed.

Figure 8A:
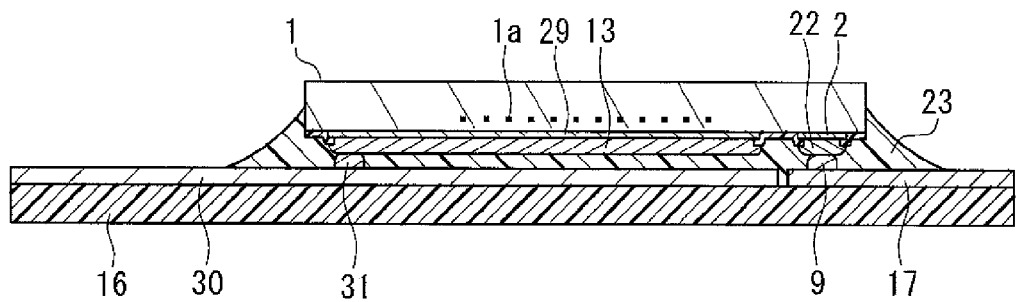
FIG. 8A is a cross-sectional view showing a semiconductor device as a fifth configuration example in Embodiment 3.
Figure 8B:
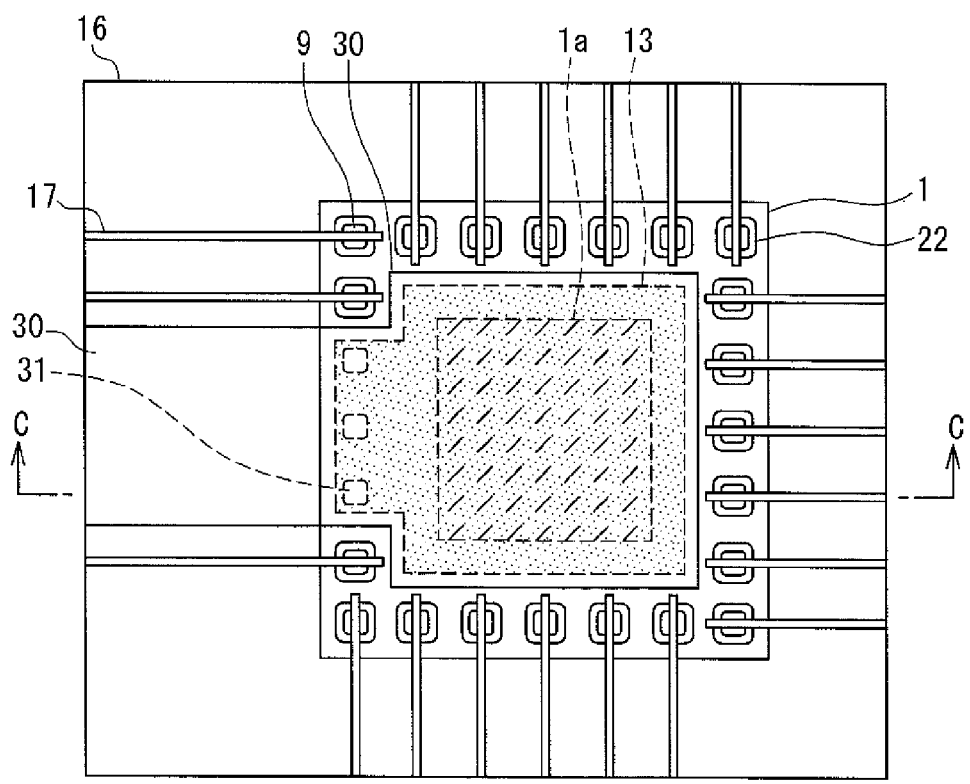
FIG. 8B is a bottom view of the same semiconductor device.

FIG. 8A is a cross-sectional view showing the semiconductor device as a fifth configuration example in the present embodiment. FIG. 8B is a bottom view of FIG. 8A, and is illustrated by viewing through some of the members. Note here that FIG. 8A shows a cross section taken along a line C-C in FIG. 8B. In FIGS. 8A and 8B, the same reference numerals are assigned to the same components as those of the second configuration example shown in FIGS. 5A and 5B for avoiding the duplication of explanations.

A feature of the semiconductor device of the present configuration example is that a heat-dissipation electrode 29 is provided that extends from above the active element region 1a to the outside of the active element region 1a so as to reach end portions of the semiconductor element 1, and the first heat-dissipation protrusion 13 is formed thereon.

Further, a second conductive wiring 30 is formed in such a manner as to extend from a position opposed to the first heat-dissipation protrusion 13 via the end portions of the semiconductor element 1 to a region where the semiconductor element 1 is not flip-chip mounted. The second conductive wiring 30 and the first heat-dissipation protrusion 13 do not come into contact with each other on the active element region 1a, and are connected via second heat-dissipation protrusions 31 formed at the position outside the active element region 1a.

According to the present configuration example, since the second conductive wiring 30 extends from the position opposed to the first heat-dissipation protrusion 13 via the end portions of the semiconductor element 1 to the region where the semiconductor element 1 is not flip-chip mounted, it is possible further to improve a heat dissipation effect.

Figure 9A:
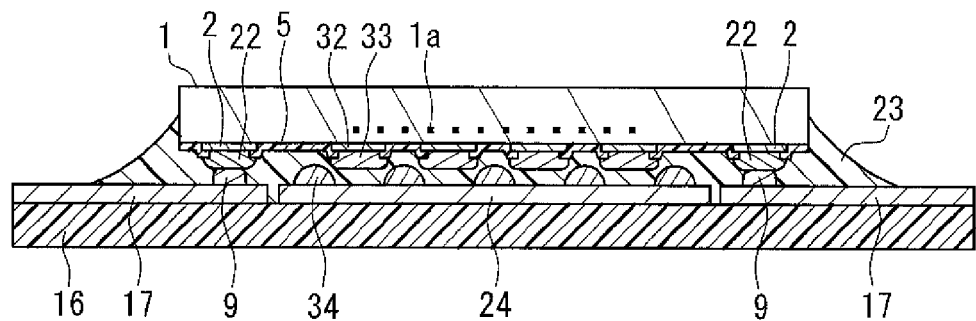
FIG. 9A is a cross-sectional view showing a semiconductor device as a sixth configuration example in Embodiment 3.
Figure 9B:
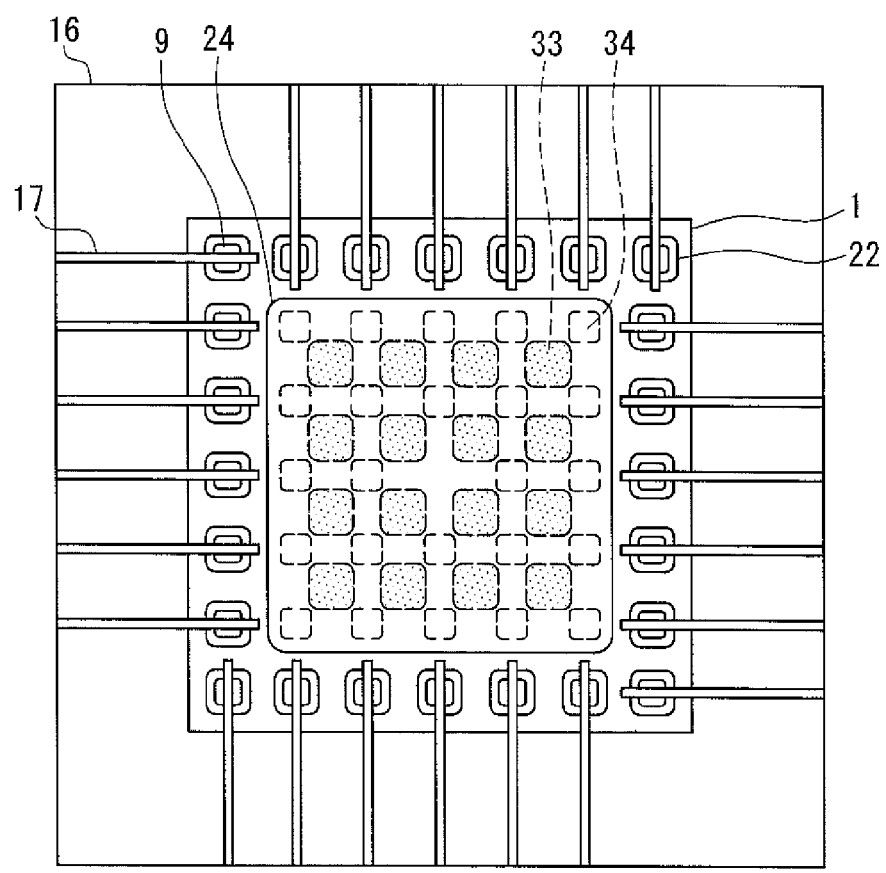
FIG. 9B is a bottom view of the same semiconductor device.

FIG. 9A is a cross-sectional view showing the semiconductor device as a sixth configuration example in the present embodiment. FIG. 9B is a bottom view of FIG. 9A, and is illustrated by viewing through some of the members. In FIGS. 9A and 9B, the same reference numerals are assigned to the same components as those of the fourth configuration example shown in FIGS. 7A and 7B for avoiding the duplication of explanations. For the sake of simplicity, the illustration of the active element region 1a is omitted in FIG. 9B.

A feature of the present configuration example is that a plurality of heat-dissipation electrodes 32 are formed in the region including the active element region 1a. A first heat-dissipation protrusion 33 is formed on each of the plurality of heat-dissipation electrodes 32.

The configuration of the second conductive wiring 24 that is formed on the portion of the wiring board 16 opposed to the first heat-dissipation protrusions 33 is identical to the case of the second configuration example. Second heat-dissipation protrusions 34 thicker than the protrusion electrodes 9 are provided on the second conductive wiring 24. Each top portion of the second heat-dissipation protrusions 34 is surrounded by adjacent top portions of first heat-dissipation protrusions 33, and the respective side faces are opposed to each other and are not in contact with each other. The insulation resin layer 23 is filled in a space between the first heat-dissipation protrusions 33 and the second heat-dissipation protrusions 34.

According to the present configuration example, since the second heat-dissipation protrusions 34 are formed higher than the protrusion electrodes 9, each top portion of the second heat-dissipation protrusions 34 is sandwiched between adjacent top portions of the first heat-dissipation protrusions 33. Thus, an area where the second heat-dissipation protrusions 34 and the first heat-dissipation protrusions 33 are opposed to each other is increased as compared with the case of the fourth configuration example, whereby it is possible further to improve the heat dissipation effect.

Figure 10A:
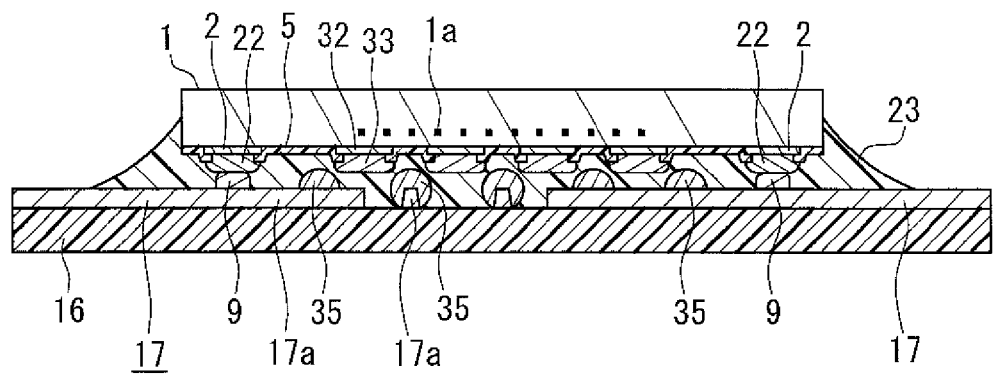
FIG. 10A is a cross-sectional view showing a semiconductor device as a seventh configuration example in Embodiment 3.
Figure 10B:
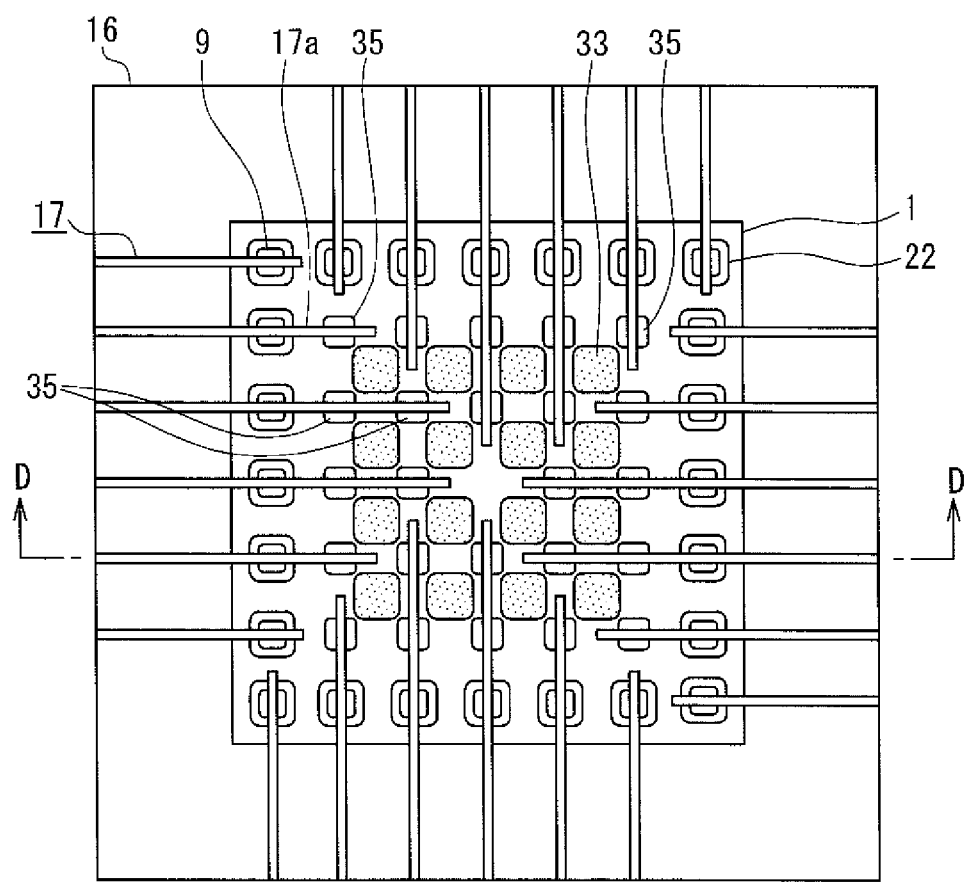
FIG. 10B is a bottom view of the same semiconductor device.

FIG. 10A is a cross-sectional view showing the semiconductor device as a' seventh configuration example in the present embodiment. FIG. 10B is a bottom view of FIG. 10A, and is illustrated by viewing through some of the members. Note here that FIG. 10A shows a cross section taken along a line D-D in FIG. 10B. In FIGS. 10A and 10B, the same reference numerals are assigned to the same components as those of the sixth configuration example shown in FIGS. 9A and 9B for avoiding the duplication of explanations.

In the present configuration example, similarly to the sixth configuration example shown in FIGS. 9A and 9B, the plurality of heat-dissipation electrodes 32 are formed in the region including the active element region 1a, and the first heat-dissipation protrusion 33 is formed on each of the heat-dissipation electrodes 32.

A feature of the present configuration example which is different from the feature of the sixth configuration example is that the first conductive wirings 17 extend toward the center of the semiconductor element 1 so that tip portions thereof form heat-dissipation wiring portions 17a, and second heat-dissipation protrusions 35 thicker than the protrusion electrodes 9 are provided on the heat-dissipation wiring portions 17a. Each top portion of the second heat-dissipation protrusions 35 is surrounded by adjacent top portions of the first heat-dissipation protrusions 33, and the respective side faces are opposed to each other and are not in contact with each other. The insulation resin layer 23 is filled in a space between the second heat-dissipation protrusions 35 and the first heat-dissipation protrusions 33.

According to the present configuration example, as compared with the sixth configuration example, a surface area where the wiring board 16 directly is in contact with the insulation resin layer 23 is increased and a surface area where the heat-dissipation wiring portions 17a and the second heat-dissipation protrusions 35 are in contact with the insulation resin layer 23 is increased. Thereby, it is possible to improve adhesion between the insulation resin layer 23 and the wiring board 16.

Figure 11A:
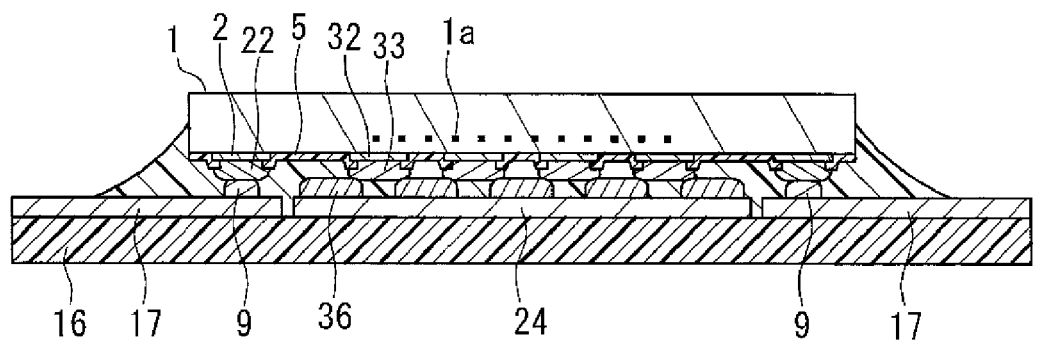
FIG. 11A is a cross-sectional view showing a semiconductor device as an eighth configuration example in Embodiment 3.
Figure 11B:
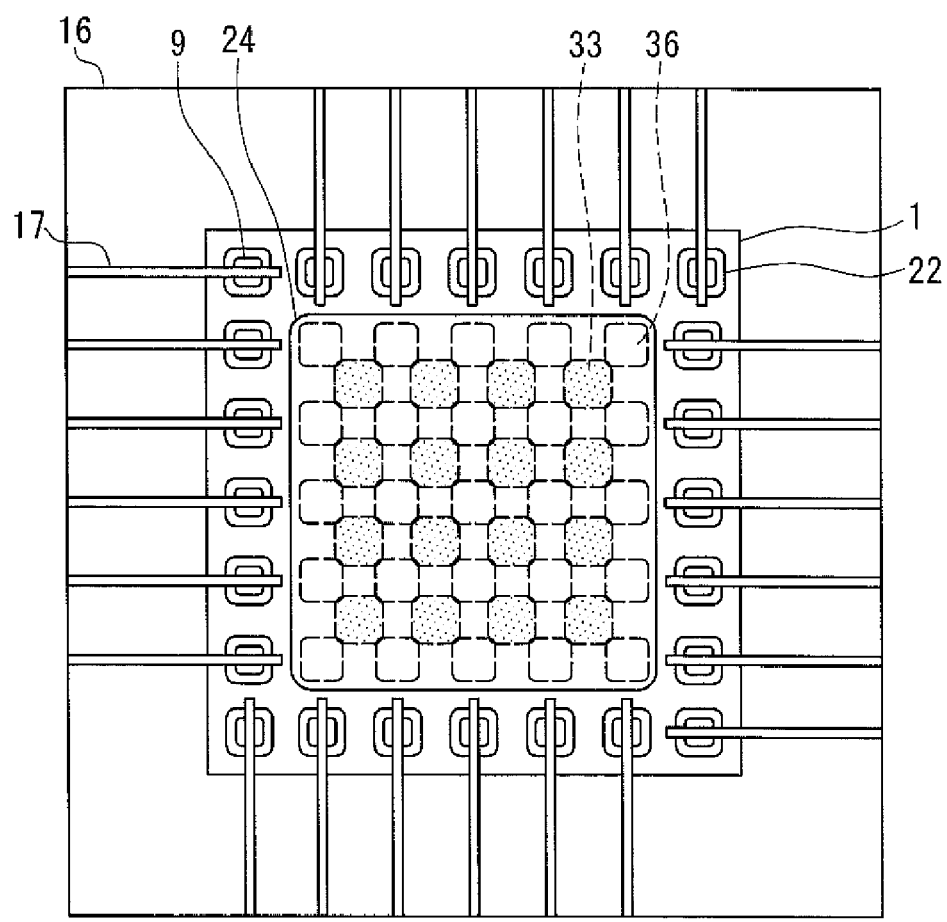
FIG. 11B is a bottom view of the same semiconductor device.

FIG. 11A is a cross-sectional view showing the semiconductor device as an eighth configuration example in the present embodiment. FIG. 11B is a bottom view of FIG. 11A, and is illustrated by viewing through some of the members. The semiconductor device of the present configuration example has a modified feature of the sixth configuration example. Therefore, in FIGS. 11A and 11B, the same reference numerals are assigned to the same components as those of the sixth configuration example shown in FIGS. 9A and 9B for avoiding the duplication of explanations.

In the present configuration example, similarly to the sixth configuration example, second heat-dissipation protrusions 36 thicker than the protrusion electrodes 9 are provided on the second conductive wiring 24 that is formed on the portion of the wiring board 16 opposed to the first heat-dissipation protrusions 33. Further, each top portion of the second heat-dissipation protrusions 36 is surrounded by adjacent top portions of the first heat-dissipation protrusions 33.

A feature of the present configuration example which is different from the feature of the sixth configuration example is that the side faces of the second heat-dissipation protrusions 36 and the first heat-dissipation protrusions 33 are opposed to each other and are in contact with each other. The insulation resin layer 23 is filled in a space where the second heat-dissipation protrusions 36 and the first heat-dissipation protrusions 33 are not in contact with each other.

According to the present configuration example, since the second heat-dissipation protrusions 36 and the first heat-dissipation protrusions 33 are in contact with each other, it is possible further to improve the heat dissipation effect as compared with the case of the six configuration example.

Figure 14:
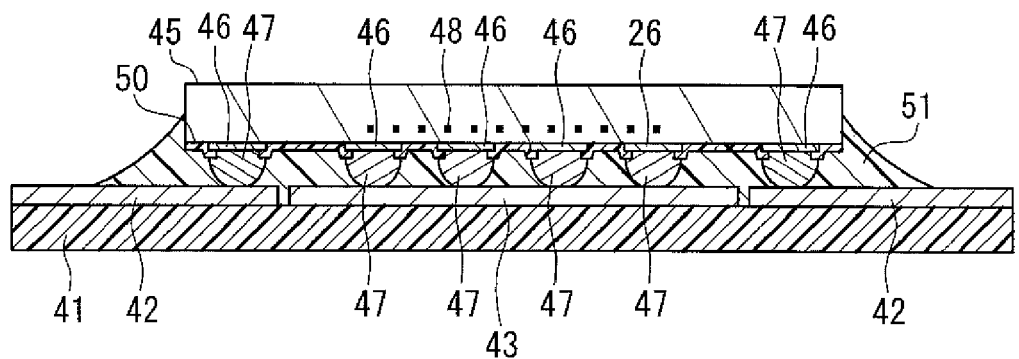
FIG. 14 is a cross-sectional view showing a semiconductor device of another conventional example.

Further, since contact portions between the second heat-dissipation protrusions 36 and the first heat-dissipation protrusions 33 are not their top portions but their side faces, it is possible to obtain an advantage of reducing variations in electric characteristics of the active element region 1a. In other words, as compared with the configuration of the conventional example 2 shown in FIG. 14, the load at the time of the flip-chip mounting of the semiconductor element 1 on the wiring board 16 or the stress to the active element region 1a that is caused by the difference in thermal expansion coefficient between the semiconductor element 1 and the wiring board 16 after the mounting does not directly act in the vertical direction. Therefore, the load or stress is dissipated in the vertical and horizontal directions, thereby reducing the variations in electric characteristics of the active element region 1a.

Embodiment 4

A method for manufacturing the semiconductor device according to Embodiment 4 of the present invention will be described with reference to FIGS. 12A and 12B. This manufacturing method is a method for manufacturing the semiconductor device of the sixth configuration example in Embodiment 3 shown in FIGS. 9A and 9B. Therefore, the same reference numerals are assigned to the same components as those shown in FIGS. 9A and 9B for avoiding the duplication of explanations.

Figure 12A:
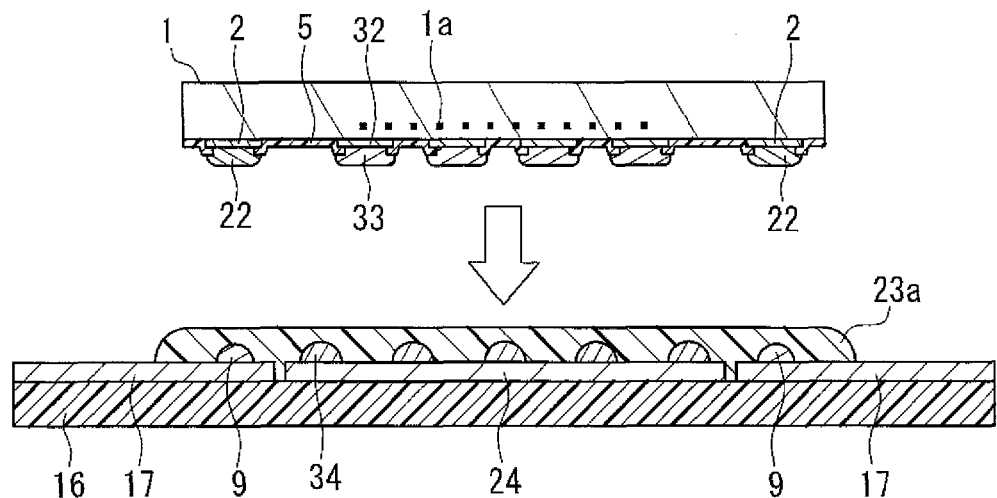
FIG. 12A is a cross-sectional view showing a step in a manufacturing method of a semiconductor device in Embodiment 4 of the present invention.

First, as shown in FIG. 12A, the wiring board 16 on which the first conductive wirings 17, second conductive wiring 24, protrusion electrodes 9 and second heat-dissipation protrusions 34 are formed, and the semiconductor element 1 on which the element electrodes 2, protrusion electrodes 22, heat-dissipation electrodes 32, first heat-dissipation protrusions 33 and passivation film 5 are formed are prepared. After that, an uncured insulation resin layer 23a is placed on the first conductive wirings 17, and the semiconductor element 1 is positioned so as to be opposed thereto.

The protrusion electrodes 9 and second heat-dissipation protrusions 34 are formed in the same height on the first conductive wirings 17 and the second conductive wiring 24 using the electro plated Cu/Au (for example, about Cu: 8 µm, Au: 0.5 µm), respectively. The protrusion electrodes 22 and the first heat-dissipation protrusions 33 are formed simultaneously on the element electrodes 2 and the heat-dissipation electrodes 32 using the electroless plated Ni/Au, respectively. Thus, the protrusion electrodes 22 and the first heat-dissipation protrusions 33 have the same thickness (for example, Ni: 3 µm, Au: 0.05 µm).

Figure 12B:
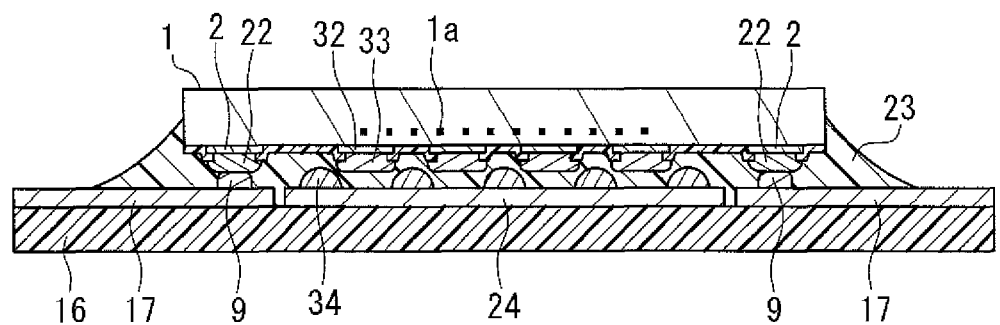
FIG. 12B is a cross-sectional view showing a step next to FIG. 12A in the manufacturing method.
Figure 13:
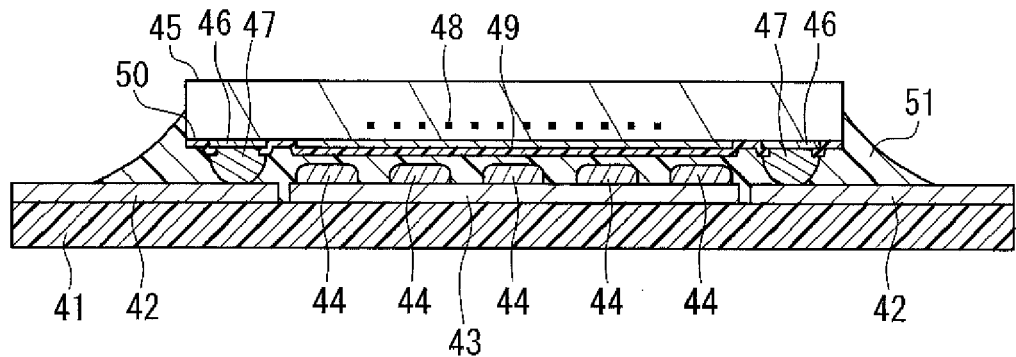
FIG. 13 is a cross-sectional view showing a semiconductor device of a conventional example.

Next, as shown in FIG. 12B, the semiconductor element 1 is flip-chip mounted on the wiring board 16, and the protrusion electrodes 9 and the protrusion electrodes 22 are connected by ultrasonic welding. At this time, since the hardness of the protrusion electrode 9 made of Cu is lower than that of the protrusion electrode 22 made of Ni, the top portion of the protrusion electrode 9 is squashed and connected to the protrusion electrode 22. At this time, the squashed amount of the top portion of the protrusion electrode 9 is controlled at about 2 µm.

Meanwhile, the first heat-dissipation protrusions 33 and the second heat-dissipation protrusions 34 are positioned to establish a horizontal positional relationship in which each top portion of the second heat-dissipation protrusions 34 is surrounded by adjacent top portions of the first heat-dissipation protrusions 33. Thus, it is possible to provide a difference in height between the protrusion electrode 9 and the second heat-dissipation protrusion 34 which corresponds to the squashed amount of 2 μm. Further, the configuration is obtained in which the side faces of the first heat-dissipation protrusions 33 and the second heat-dissipation protrusions 34 are opposed to each other and are not in contact with each other.

After that, by curing the uncured insulation resin layer 23a, the semiconductor device is completed.

According to the manufacturing method of the semiconductor device described above, the second heat-dissipation protrusions 34 are formed thicker than the protrusion electrodes 9; besides, the first heat-dissipation protrusions 33 and the second heat-dissipation protrusions 34 are positioned to establish a positional relationship in which each top portion of the second heat-dissipation protrusions 34 is surrounded by adjacent top portions of the first heat-dissipation protrusions 33, and the respective side faces are opposed to each other. Thus, the area where the second heat-dissipation protrusions 34 and the first heat-dissipation protrusions 33 are opposed to each other is increased as compared with the case of Embodiment 1, thereby realizing the configuration capable of improving the heat dissipation effect by a single ultrasonic connection step.

The present invention is useful as a heat dissipation technology in the semiconductor device capable of improving the speed of dissipating heat from the active element region to the heat-dissipation medium of the semiconductor element.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor device comprising:
a semiconductor element having an active element region;
a plurality of element electrodes formed on a principal face of the semiconductor element;
an external terminal connected to the one or more element electrodes via a connection member;
one or more first heat-dissipation protrusions formed on the principal face of the semiconductor element;
an insulation resin layer covering the principal face of the semiconductor element and the first heat-dissipation protrusion; and
a heat-dissipation medium contacting a face of the insulation resin layer on a side opposite to a side contacting a front face of the first heat-dissipation protrusion,
wherein at least a part of the active element region is included in a region below a bottom face of the first heat-dissipation protrusion,
the first heat-dissipation protrusion is not connected to the external terminal within the active element region,
a thermal conductivity of the first heat-dissipation protrusion is larger than a thermal conductivity of the insulation resin layer, and
a thickness of the insulation resin layer from the front face of the first heat-dissipation protrusion to the heat-dissipation medium is thinner than a thickness of the insulation resin layer from the principal face of the semiconductor element to the heat-dissipation medium.

2. The semiconductor device according to claim 1, wherein the first heat-dissipation protrusion is formed so as to extend from above the inside of the active element region to the outside thereof and is connected to the external terminal outside the active element region.

3. The semiconductor device according to claim 1, wherein the first heat-dissipation protrusion contains the same material as that of the connection member.

4. The semiconductor device according to claim 1, wherein a thermal conductivity of the heat-dissipation medium is larger than the thermal conductivity of the insulation resin layer.

5. The semiconductor device according to claim 1,
wherein the heat-dissipation medium is a wiring board,
the semiconductor element is flip-chip mounted on the wiring board,
the external terminal is formed of a part of a conductive wiring formed on the wiring board,
the first heat-dissipation protrusion is formed so as to extend from above the inside of the active element region to the outside thereof and is connected to the external terminal outside the active element region, and
the conductive wiring is formed so as to extend from a region opposed to the first heat-dissipation protrusion via end portions of the semiconductor element to a region where the semiconductor element is not flip-chip mounted.

6. The semiconductor device according to claim 1,
wherein the heat-dissipation medium is a wiring board,
the semiconductor element is flip-chip mounted on the wiring board,
the wiring board comprises:
a plurality of first conductive wirings formed on an upper face of the wiring board;
a second conductive wiring formed on the wiring board at a position opposed to a region where the first heat-dissipation protrusion is formed; and
a plurality of second heat-dissipation protrusions formed on the second conductive wiring,
a part of the first conductive wiring functions as the external terminal and is connected to the element electrode via the connection member,
each top portion of the second heat-dissipation protrusions is surrounded by adjacent top portions of the first heat-dissipation protrusions and the respective side faces are opposed to each other without contacting with each other, and
an insulation resin is filled in a space between the second heat-dissipation protrusions and the first heat-dissipation protrusions.

7. The semiconductor device according to claim 6, wherein an end portion of the first conductive wiring on a side connected to the element electrode via the connection member extends toward a center of the semiconductor element so as to form the second conductive wiring.

8. The semiconductor device according to claim 1,
wherein the heat-dissipation medium is a wiring board,
the semiconductor element is flip-chip mounted on the wiring board,
the wiring board comprises:
a plurality of first conductive wirings formed on an upper face of the wiring board;
a second conductive wiring formed on the wiring board at a position opposed to a region where the first heat-dissipation protrusion is formed; and
a plurality of second heat-dissipation protrusions formed on the second conductive wiring,
the element electrode and the first conductive wiring are connected via the connection member,
each top portion of the second heat-dissipation protrusions is surrounded by adjacent top portions of the first heat-dissipation protrusions and the respective side faces are opposed to each other and in contact with each other, and an insulation resin is filled in a space between the second heat-dissipation protrusions and the first heat-dissipation protrusions.

9. A method for manufacturing a semiconductor device, comprising:

forming a first conductive wiring and a second conductive wiring on a wiring board;

forming a plurality of wiring protrusion electrodes on the first conductive wiring and a plurality of second heat-dissipation protrusions on the second conductive wiring in the same thickness;

forming an element protrusion electrode on each of a plurality of element electrodes formed on a principal face of a semiconductor element and a first heat-dissipation protrusion on each of a plurality of heat-dissipation electrodes formed on the principal face of the semiconductor element in the same thickness using a material having a hardness higher than a hardness of a material of the wiring protrusion electrodes;

arranging the wiring board and the semiconductor element so that the wiring protrusion electrode and the corresponding element protrusion electrode are opposed to each other, and the first heat-dissipation protrusion and the second heat-dissipation protrusion establish a horizontal positional relationship in which a top portion of one of the heat-dissipation protrusions is surrounded by adjacent top portions of the other heat-dissipation protrusion; and flip-chip mounting the semiconductor element on the wiring board by connecting the element protrusion electrode and the wiring protrusion electrode while squashing the top portion of the wiring protrusion electrode, in such a manner as to arrange the top portion of the first heat-dissipation protrusion and the top portion of the second heat-dissipation protrusion at a position where the respective side faces are opposed to each other.

* * * * *